United States Patent [19]

Hasbun et al.

[11] Patent Number: 5,357,475
[45] Date of Patent: Oct. 18, 1994

[54] METHOD FOR DETACHING SECTORS IN A FLASH EEPROM MEMORY ARRAY

[75] Inventors: Robert N. Hasbun, Shingle Springs; Steven E. Wells, Citrus Heights; Richard P. Garner, Cameron Park, all of Calif.

[73] Assignee: Intel Corporation, Santa Clara, Calif.

[21] Appl. No.: 969,466

[22] Filed: Oct. 30, 1992

[51] Int. Cl.⁵ .................. G11C 29/00; G11C 11/34
[52] U.S. Cl. .................... 365/218; 365/200; 371/10.1; 371/10.2; 371/11.1; 371/21.1
[58] Field of Search ............. 365/218, 200; 371/10.1, 371/10.2, 11.1, 21; 395/575

[56] References Cited

U.S. PATENT DOCUMENTS

| | | | |
|---|---|---|---|
| 4,644,494 | 2/1987 | Muller | 364/900 |
| 4,757,533 | 7/1988 | Allen et al. | 380/25 |
| 4,763,305 | 8/1988 | Kuo | 365/201 |
| 4,802,117 | 1/1989 | Chrosny et al. | 364/900 |
| 4,896,262 | 1/1990 | Wayama et al. | 364/200 |
| 4,958,315 | 9/1990 | Balch | 364/900 |
| 5,131,089 | 7/1992 | Cole | 395/500 |
| 5,200,959 | 4/1993 | Gross et al. | 371/21.6 |

FOREIGN PATENT DOCUMENTS

| | | |
|---|---|---|
| 2088442 | 7/1993 | Canada . |
| 0175458A2 | 3/1986 | European Pat. Off. . |
| 0392895 | 10/1990 | European Pat. Off. . |
| 2665791 | 2/1992 | France ................ 365/218 |
| 251324 | 1/1992 | United Kingdom . |
| 2251323 | 1/1992 | United Kingdom . |

OTHER PUBLICATIONS

Solid-State Mass Storage Arrives, Product Feature, Memory Card Systems & Design, Jul./Aug. 1992.
Optimal Solid State Disk Architecture for Portable Computers, Dan Auclair, pp., 811-815, Proceedings of Silicon Valley P.C. Design Conference, Jul. 9, 1991.

Primary Examiner—Viet Q. Nguyen
Attorney, Agent, or Firm—Blakely, Sokoloff, Taylor & Zafman

[57] ABSTRACT

A process for releasing sectors of a flash EEPROM memory array which includes a plurality of individually erasable blocks and stores sectors of data in such blocks with a header providing a logical sector number, an indication of validity of data stored, and an indication of whether data is stored with the header. The process includes the steps of finding the header of a sector with data to be released, setting the indication of validity of the data stored to indicate that the data is invalid, and writing a new header for the sector to a new position in the array without data and with an indication that data is not attached.

4 Claims, 3 Drawing Sheets

METHOD FOR DETACHING SECTORS IN A FLASH EEPROM MEMORY ARRAY

BACKGROUND OF THE INVENTION

1. Field Of The Invention

This invention relates to flash electrically-erasable programmable read-only memories (flash EEPROM) and, more particularly, to methods for releasing portions of such arrays in which data is stored which is no longer of value so that the efficiency of the process for storing and maintaining the memories is increased.

2. History Of The Prior Art

Modern computer systems make extensive use of long term memory. Typically this memory is provided by one or more electro-mechanical hard (fixed) disk drives made of flat circular magnetic disks which rotate about a central axis and which have a mechanical arm to write to or to read from positions on the magnetic disk. Hard disk drives are very useful and have become almost a necessity to the operation of personal computers. However, such electro-mechanical drives are relatively heavy, require a significant amount of space within a computer, require a significant amount of the power in use, and are very susceptible to shock. A hard drive within a portable computer which is dropped is quite likely to cease functioning with a catastrophic loss of data.

Recently, forms of long term storage other than electro-mechanical hard disk drives have become feasible for use in computers. One of these is flash EEPROM. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed. Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk drive.

A peculiarity of flash EEPROM, however, is that it is erased by applying a high voltage simultaneously to the source terminals of all of the transistors (cells) used in a large portion of the array. Because these source terminals are all connected to one another in the array by metallic busing, the entire portion of the array must be erased at once. While an electro-mechanical hard disk drive will typically store information in a first area of the disk and then rewrite that same area of the disk when the information changes, this is not possible with a flash memory array without erasing all of the valid information that remains in that portion of the array along with the invalid (dirty) information.

Because of this, a different arrangement may be advantageously used for rewriting data and erasing dirty sectors of a flash EEPROM array. In a recently devised arrangement, the entire array is divided into smaller separately erasable blocks so that when a block is erased the amount of valid data which must be reprogrammed is reduced. Such an array is composed of a number of silicon chips; and each such chip includes a number of such blocks. Then, when the information at a data entry changes, the changed information is written to a new sector on an available block rather than written over the old data; and the old data is marked dirty. After a sufficient number of sectors on a block have been marked dirty, the entire block is erased. When erasure occurs, all of the valid data in the block to be erased is written to a new block; and then the dirty block is erased and put back into use as a clean block of memory. Because of this involved erasure process, it typically takes as much as two seconds to erase a block of a flash EEPROM array. However, because erasure need not occur with each entry which is rewritten, erasure may be delayed until a block contains a sufficient amount of dirty information that cleanup is feasible. This reduces the number of erasure operations to a minimum and allows erasure to occur in the background when the facilities for controlling the array are not otherwise occupied with reading and writing. Such an arrangement is described in U.S. patent application Ser. No. 07/969,131, entitled *Method And Circuitry For A Solid State Memory Disk*, S. Wells, filed Oct. 30, 1992, and assigned to the assignee of the present invention.

The typical personal computer operating system was not designed to handle such a memory arrangement. For example, the Microsoft DOS operating system (hereinafter DOS) allocates long term memory space through the use of a file allocation table associated with the particular memory hardware. When an electro-mechanical hard disk drive is first put into use, it is divided into sectors each of a fixed size and residing at a fixed place on the drive media. Each sector is numbered. The file allocation table is a way for the DOS operating system to figure out which sectors on a disk are used for a file. The file allocation table is a linked list that maps the file to the sectors; each link in the list includes a number of sectors allocated to a particular file and points to the next link. The DOS system typically saves the file allocation table on the disk with which the table is associated. The DOS system includes a utility program called delete which hunts out the sectors related to the files the user wants to remove and marks those sectors as free in the file allocation table. When the host computer then desires to write to an electro-mechanical hard disk drive, it may write data to those sectors over the data previously stored. The data previously stored does not have to be erased for a sector to be rewritten in an electro-mechanical hard disk drive.

However, this is not true in a flash disk memory array because each block of the array must be erased before new data may be written to it. Thus, information which though valid is no longer of use to the operator of the computer is left in the memory array reducing the efficiency of storage. Consequently, a new method for releasing space in a flash memory array which stores information which though valid is no longer of use to the operator of the computer would be useful.

SUMMARY OF THE INVENTION

It is, therefore, an object of the present invention to provide a method for releasing allocated space in a flash EEPROM memory array occupied by out-of-date data so that processes controlling the memory array may operate more efficiently.

It is an additional object of the present invention to provide a method for automatically deattaching space occupied by out-of-date data in a flash EEPROM memory array to increase the efficiency of operation of the array.

These and other objects of the present invention are realized in a method for releasing for use by new data sectors of a flash EEPROM memory array which includes a plurality of individually erasable blocks and stores sectors of data in such blocks with a header providing a logical sector number, an indication of validity of data stored, and an indication of whether data is stored with the header. The process includes the steps of finding the header of a sector to be released, setting the indication of validity of the data stored to indicate that the data is invalid, and writing a new header for the sector to a new position in the array without data and with an indication that data is not attached.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

Figure 1:
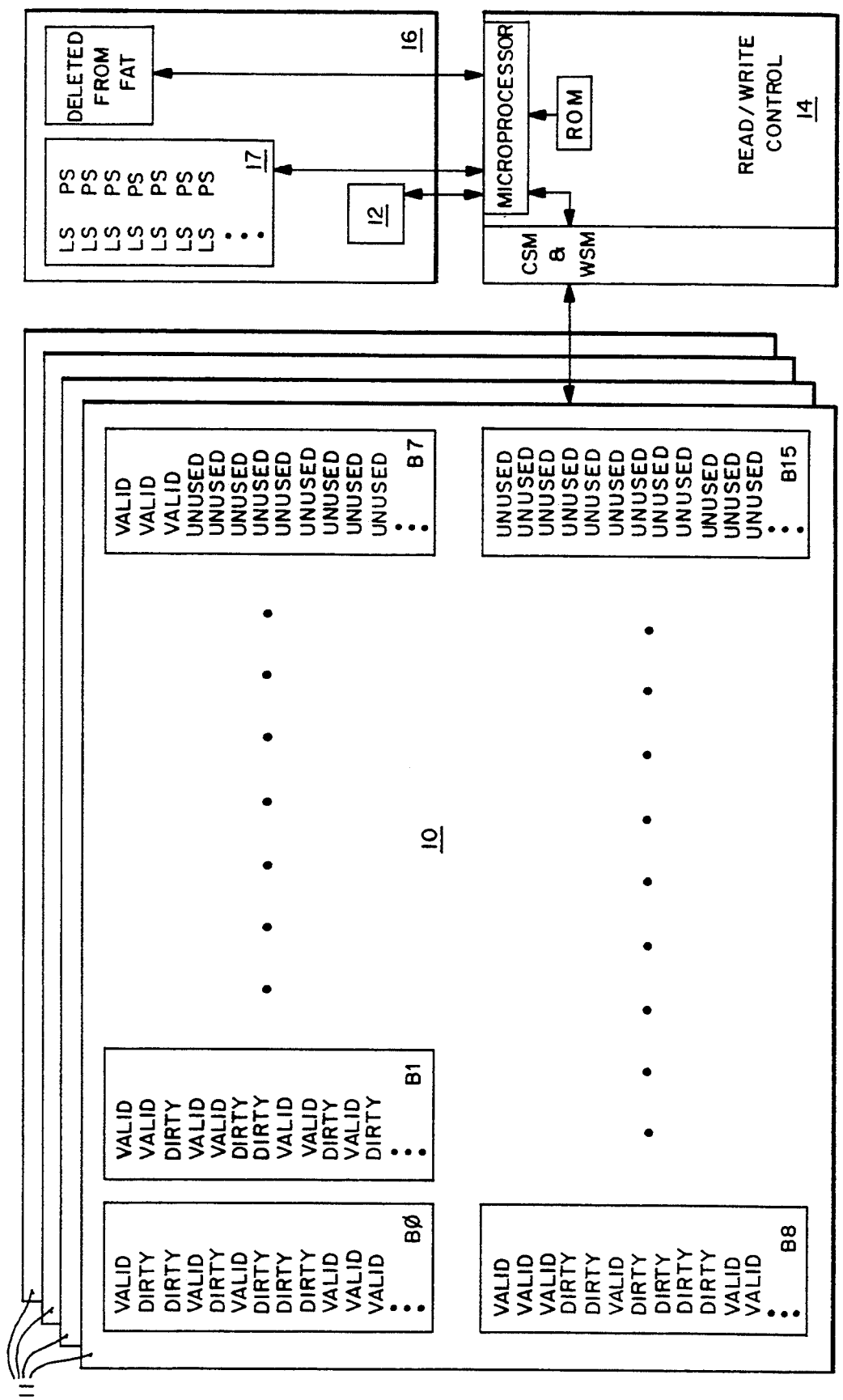
FIG. 1 is a block diagram illustrating a flash EEPROM memory array in which the present invention may be used.

Referring now to FIG. 1, there is illustrated in block diagram form a flash EEPROM memory array 10 in which the present invention may be practiced. The array 10 includes a plurality of blocks B0–B15 of flash EEPROM memory. Each block includes floating-gate field effect transistor memory devices or cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

As has been described above, flash EEPROM memory is essentially an EPROM array with facilities provided so that when divided into blocks in the manner illustrated an entire block of CMOS memory cells may be erased by a high voltage value applied simultaneously to the source terminals of all the memory transistors of the block. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since all source terminals of the memory transistors of a block are joined together, a cell in a zero state remains in that state until the entire block of the array is erased once again.

In the array 10 illustrated in FIG. 1, blocks B0–B15 of memory are shown positioned on a first chip 11 of the array 10. Additional silicon chips 11 each hold additional blocks of the array 10 to provide a total number of blocks sufficient to furnish the desired size of memory array.

Once any one of the blocks has been erased, data may be written to any position on the entire block. When, a host begins writing (in a manner to be described) the data to be stored in the array (such as an application program) to some block of the array having free space, the data to be stored in the array 10 is written sequentially, sector by sector, to the free space in this first block until that block has been filled with data. Then writing proceeds to the next sequential block having free space. At any point after writing is completed, the information may be read back from the array 10 by interrogating the block and sector at which the data is stored.

When updated information is to be written to a sector which already contains information, in contrast to the prior art, the new information is written to new or newly-erased free space on some one of the blocks of the array 10. This, rather than writing over the old information, occurs because the old information can only be rewritten if the entire block on which it is stored is first erased. To erase an entire block without destroying valid data would entail copying all of the valid data to another block of the array 10, erasing the original block, rewriting the valid data back to the original block, then rewriting the updated data over the old entry on the original block. Instead the updated information is written to a new position on a different unfilled block (e.g., block B7), and the old position is marked invalid (dirty). A block is usually not erased until a large number of dirty sectors exist on the block and the number of valid sectors on the block which must be saved is substantially reduced.

Because of this arrangement by which data is replaced in the array by writing it to a different physical position, the sector number which is used to indicate where data is stored is really a logical sector number. In order to allow the use of logical sector numbers, a lookup table 17 (held in static random access memory 16 in one embodiment) listing logical sector numbers against physical sector positions is utilized with the array 10 so that the physical position in the array 10 at which any particular logical sector exists may be determined.

Also, because of this arrangement by which data is replaced, each block of the array will after some time have a number of entries which are marked invalid and cannot be used for storage. Consequently, as the array 10 fills with data, a point will come when it is necessary to clear out invalid data from a block in order to provide space for new data to be stored. Typically, the dirtiest block of the array 10 is chosen for erasure. This allows the smallest amount of valid data to be moved to another block of the array from the block to be erased. Once the valid data is written to another block and the new physical addresses are recorded in the lookup table 17, the block from which the information was read is erased. It is then placed back into operation as an entirely clean block.

Figure 2:
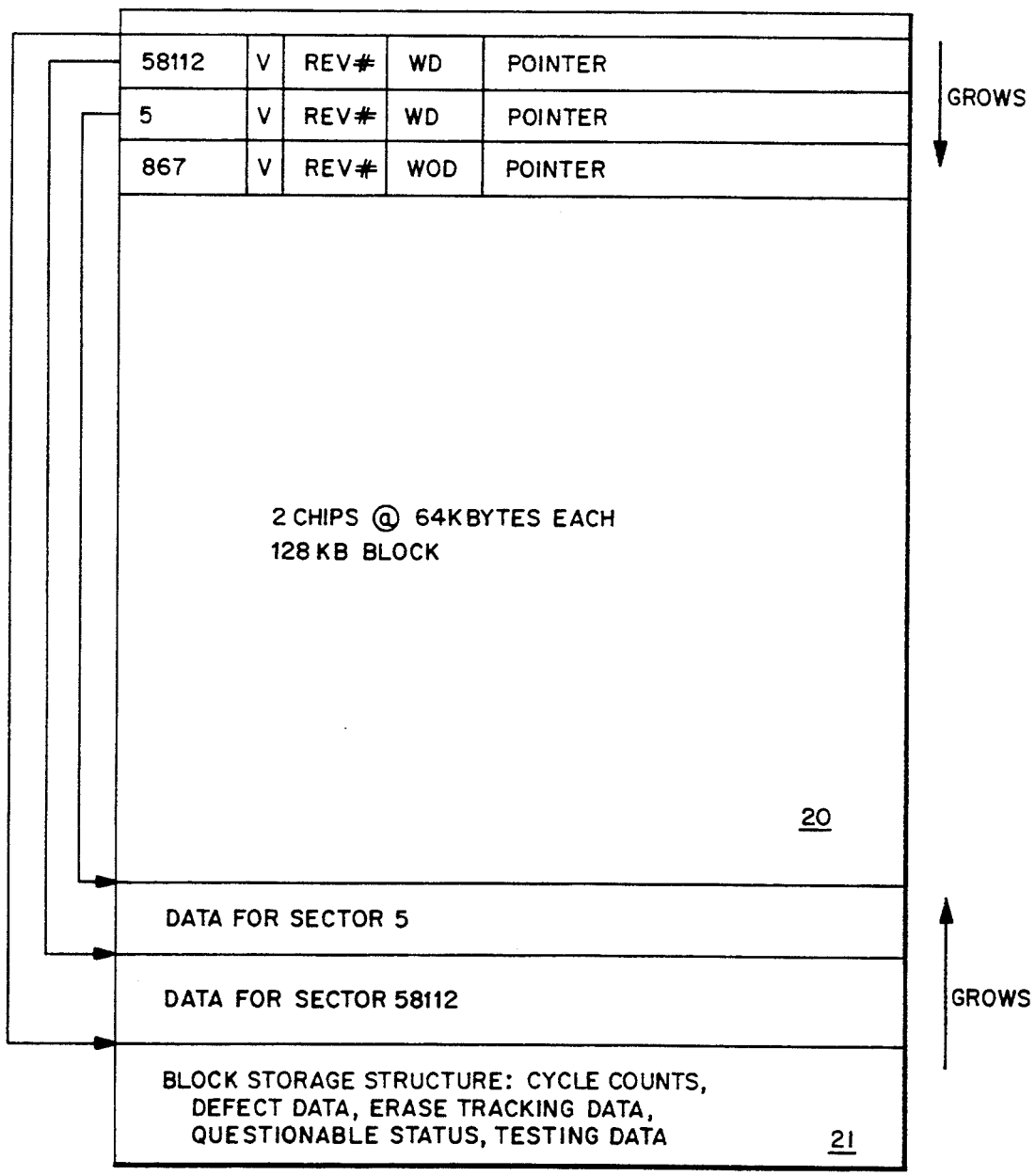
FIG. 2 is a diagram illustrating an individual block of the flash EEPROM memory array of FIG. 1.

FIG. 2 is an idealized drawing which illustrates one arrangement of an individual block of the array 10 and is useful in describing the way data is stored. A typical block 20 is illustrated as a rectangular area. The area includes a plurality of transistor devices typically arranged in rows and columns to provide the desired storage.

The individual transistors and the various column and row select lines and other conductors for operating the block are not illustrated but are well known to those skilled in the art of designing flash memory.

As may be seen in FIG. 2, data is stored in the block 20 beginning at the top of the block and near to the bottom. At the top of the block 20 are stored the logical sector numbers used by the operating system as addresses for the data in an identification field referred to as a sector translation table or "header." For example, a first sector number 58112 is stored as a part of the first header at the top. In the header with the sector number are stored a pointer value and a set of attributes. The attributes included in one embodiment are an indication of the validity of the entry, a revision number, an indication whether the data is compressed or not, and a bit which indicates whether the entry includes data. The indication of the validity of the entry stores at least one bit which indicates valid when it is a one value and invalid when it is a zero value; in one embodiment, two bits are used and both must be ones to indicate a valid entry. The revision number is, in one embodiment, a four bit number. The bit which indicates whether the entry includes data or not is utilized to allow sectors to be created without data. This is the initial state of sectors on a block when the array is first formatted. This allows information regarding the condition of sectors to be transferred to the host computer even though those sectors have not been used or are not presently in use to store data.

The pointer value points to a physical address on the block 20 which is an offset from the beginning of the block at which the data for logical sector 58112 is stored. An arrow in FIG. 2 illustrates this physical position at which the first byte of data for the logical sector is stored. In the case of logical sector 58112 which is the first sector on the block 20, the data is written from the position indicated by the pointer stored with the sector number 58112 in the header to a point at the beginning of the data area which is marked by a beginning pointer value illustrated by an arrow extending from the upper left hand corner of the block 20. FIG. 2 also shows a second logical sector 5 and its pointer directed to a physical position on the block 20 which stores the first byte of the data for sector 5.

The header for a third logical sector number 867 is also shown; this sector includes an indication "WOD" that "no data is attached." By the use of this indication, the header may be positioned on a block of the array, yet the space usually allocated for data is not used. This allows various information about the sector to be transferred to the host without a great deal of space being used. In one embodiment, a header requires only four words (eight bytes) of memory in the array whereas a sector of data may use as much as 512 bytes of memory.

As was pointed out above, the physical position of the sector number is stored in a lookup table 17 (which is preferably held in random access memory 16) with the chip number, the block, and other information (such as the position in the block) for retrieving the data. The data stored in any sector of the block 20 may be retrieved by retrieving the physical position of the logical sector number from the table 17 in random access memory 16, going to the position on the block 20 where the sector number is stored, and retrieving the pointer to the beginning position of the data and the pointer to the beginning position of the sector whose number is stored immediately above the sector number being retrieved. These two values determine the starting and ending positions (its size) for the sector the data of which is sought.

An arrangement has been devised to control the operation of the programming, reading, and erasing of the flash EEPROM memory array. This arrangement is shown as a read/write control circuit 14 in FIG. 1. The control circuit 14 utilizes a microprocessor such as the Intel 80188 processor to execute various processes stored in read only memory within the control circuit 14. These processes utilize random access memory 16 to provide various services which allow the array 10 to be utilized as long term storage in the manner described.

The control circuit 14 shown in FIG. 1 is also illustrated as including a command state machine which provides a command interface between the control circuit 14 and the flash EEPROM memory array. In one embodiment, the command state machine and the write state machine actually reside on each of the chips 11. The command state machine controls the programming, reading, and erasing of the flash EEPROM memory array. The command state machine using the write state machine sequences the data flow to and from the array to ensure that the writing to, the reading from, and the erasure of the array take place properly. The microprocessor of the controller 14 controls the transfer of information between the host and the array and runs processes to provide services to the array; in doing so, the microprocessor may make use of various operations provided by the command state machine. Details of the command state machine and the write state machine are disclosed in U.S. patent application Ser. No. 07/655,643, entitled *Command State Machine*, Fandrich et al, filed Feb. 11, 1991, and assigned to the assignee of the present invention, and in U.S. patent application Ser. No. 07/654,375, entitled *Circuitry and Method For Programming and Erasing A Non-Volatile Semiconductor*

*Memory,* Kynett et al, filed Feb. 11, 1991, and assigned to the assignee of the present invention.

Because it controls all information passed between the host and the command state machine interface to the memory array, the microprocessor of the control circuit 14 is able to control the operations so that the external host which is writing to and receiving information from the flash array is typically not aware that an erasure is taking place even though the erasure may require one or two seconds.

When the flash EEPROM memory array described is manufactured for use in place of an electro-mechanical hard disk drive, it typically receives low level formatting. This low level formatting stores on the blocks of the array data to define all of the logical sectors which may exist in a drive of the particular size. For example, one embodiment of a forty megabyte drive will have approximately 83,000 sectors placed on a first number of blocks; approximately the first forty blocks of the 240 blocks available in in this array will hold such preformatted sectors. In this embodiment, a limited number of sectors (2047 in one embodiment) may be placed on each of a first number of the blocks of the array; the remaining blocks contain free space. Each of these sectors has a logical sector number and the remainder of the information necessary to complete the header fields. However, since none of the sectors includes data at this point in time, the data attached bit of the attribute field indicates that no data is attached to the sector.

Each time power is applied to the array, the microprocessor of the controller 14 runs a process which reviews all of the blocks of the array and compiles the table 17 from the valid logical sector entries found. These valid logical sector numbers are listed in the table 17 along with the physical offset, block, and chip at which they are positioned. Since the addressing scheme used treats the host address as a logical address and records that logical address along with the physical position in the table 17 in random access memory 16, this table 17 must be updated whenever data is written to the array. The writing of changed data to a new physical address requires that the lookup table entry in table 17 be updated with the new physical position of the sector in the array and that the old entry on the block to be erased be marked as invalid by programming the valid bit(s) of the header to zero. The old entry must be so marked so that the RAM lookup table 17 may be accurately constructed after power is removed and reapplied.

The normal manner in which the writing of data takes place is as follows. Each sector of data is provided by the host with the number of the cylinder, head, and sector to which it is to be written. The microprocessor uses a conversion equation to change this value from the format used by an electro-mechanical drive to a logical sector number for use by the controller 14. The controller 14 looks up the logical sector number in the table 17 and finds the physical position of the sector in the array. The controller then finds the sector header in the block of the array on which it is positioned. The first time any sector is written, the header will be one which describes the sector as having no data attached (the low level format condition). The controller 14 marks the old sector header invalid, then assigns free space (space not already assigned to a sector) on some block of the array to the sector, and writes a new header to the free space. This header includes, among other things, the logical sector number, a pointer to a position on the block at which the data will commence, and an indication that data is attached. The controller then writes the data furnished by the host to the data space at the new entry position for the sector. The controller 14 then updates the table 17 with the new physical position of the sector.

This places the table 17 in condition so that the changed (new information) may be recovered. This also leaves the old sector marked invalid so that it may be cleaned up when a sufficient number of sectors of the array have been marked dirty.

Because the space marked dirty on a block cannot be released for use until the entire block is erased, each block of the array will after some time have a number of entries which are marked dirty and cannot be used for storage. Thus, the amount of dirty space in the array will mount as the array is used to store data. After some period of time, a sufficient amount of invalid data will exist that it will be desirable to release space by moving the valid information from some especially dirty block to some other block and erasing the entire block from which the valid information has been removed. The process of writing valid data to other blocks and erasing a dirty block is referred to as "cleaning up a block" and has the effect of freeing up an additional number of sectors equal to all of the sectors on the erased block which have previously been marked as dirty. This process is run by the microprocessor of the controller 14.

Typically, when cleanup takes place, the dirtiest block of the array is chosen for erasure. This allows the smallest amount of valid data to be moved from the block being erased to another block of the array. The process is essentially similar to that by which data is written by the host except that the header of a sector is not completed until the valid data has been moved. The controller 14 picks a block of the array to clean up. It finds another block of the array having free space. For each valid sector on the block being erased, the controller writes a header on the block containing the free space which header includes only a pointer to the position for the data for that sector. The controller 14 then writes the valid data from the old sector on the block being cleaned up. When the data has been written, the controller completes the header with the logical sector number and the valid indication from the old header, and invalidates the old header. This delay in completing the header allows changes which occur during the period in which the cleanup write operation is taking place to be taken care of without any loss of data. For example, a power loss leaves data available at the old position even though the write is not completed. The controller then updates the table 17 for the sector and goes to the next valid sector on the block being cleaned up.

Once all of the valid information has been written to another block(s) and the new physical addresses have been recorded in the lookup table 17, the block from which the information was read is erased. It is then placed back in operation as an entirely clean block of free space. In order to allow this cleanup operation to occur, some number of blocks must be kept in reserve to be used when cleanup is necessary. In one arrangement in which the present invention is utilized, fourteen blocks of the 240 blocks available are used to provide sufficient space for both continuing write operations and for cleanup operations. The cleanup process is described in detail in U.S. patent application Ser. No. 07/969,760, entitled *A Method Of Cleaning Up A Solid State Memory Disk Storing Floating Sector Data,* S.

Wells, filed on Oct. 30, 1992, and assigned to the assignee of the present invention.

As will be understood from the above discussion, it is only sectors which are marked dirty which are erased. Sectors are marked dirty only when revised information is written to a sector or when the cleanup process moves valid data from a sector during the cleanup process. Sectors are not marked dirty when an operating system using a process such as the DOS "delete" process marks a table such as the file allocation table kept by DOS to indicate that the file has been deleted. Consequently, data cannot be written to space held in sectors of the array which have been marked free by the host in the file allocation table until the block on which those sectors reside has been erased. When the user desires to remove the data from the array, all that has occurred using the prior art "delete" process is that the file allocation table kept by the host operating system has been marked to indicate that the space is free; however, the sectors in the block of flash memory are still marked valid and cannot be overwritten.

The sectors allocated to the file which has been "deleted" by the operating system continue as valid sectors within the flash EEPROM memory array. It is not until the host attempts to write to these supposedly free sectors that they are marked dirty. Consequently, the data in each of these sectors will continue to occupy space in the array which might be otherwise used; and the cleanup process will continually move these valid sectors from block to block with other valid sectors.

There are two consequences of the cleanup process moving the data about as though it were useful data. First, moving the data takes time and lengthens the cleanup process. Second, files become more fragmented as they are moved from block to block during the cleanup process; and this slows the initiation of the cleanup process making it less efficient.

The second consequence is not self evident. Data is written to the blocks of the flash EEPROM memory array sequentially. Thus, when a file is written to the flash EEPROM memory array, the sectors of that file are initially arranged in physical sequence on the block or blocks to which the file is written. The sectors of a file are gradually distributed over different blocks (fragmented) as the cleanup process occurs. The cleanup process only cleans up a block when it contains a large amount of invalid data. If all of the sectors of a file in a flash EEPROM array were to lie in sequence and were marked dirty as soon as the operating system deleted the file in the file allocation table, then all of those sectors would probably be concentrated on one or more blocks of the array. This would cause the particular block to be cleaned up rapidly. This has not occurred. Instead, the sectors of a deleted file containing the otherwise useless but valid information remain valid; and are gradually scattered among the blocks of the array as the cleanup process occurs in response to other invalid sectors on the blocks. This causes the cleanup of blocks to occur much less efficiently.

This invention relates to a new process (referred to hereinafter as a deattaching process) which may be practiced to release the space in the array used by the data which it is desired to remove from storage but which has been left by a host system "delete" process. This process makes use of the "data not attached bit" discussed earlier which may be set in the header of a sector. The deattach process, in essence, rewrites the header of the valid sector containing the data to be deattached to a new position in free space in the array. The header of this new entry has the "data not attached" bit set, and the data is not transferred from the old entry as the new entry is written. Then the old sector entry including the data is invalidated, and the table 17 is updated to list the new physical position of the logical sector. When the cleanup process occurs (which will happen rapidly if a large amount of data is being deattached and sectors are being invalidated), the block on which the old sector was positioned will be erased. This will release for each sector so deattached on the block, space equal to the space occupied by the data which was stored.

The process of the present invention may be initiated in any manner by which a sector from which the data is to be deattached is presented to the microprocessor of the controller 14 along with the command "deattach." For example, the process might be initiated whenever a host command to delete a file stored in the array is run. The deattach process might as well be initiated by other processes to increase system efficiency.

When the deattach process occurs, it finds each sector to be deattached, writes the sector of the file to free space but without data attached, and marks the old sector as dirty. Marking the old sector dirty allows the cleanup process to cleanup the old sectors in which the data is stored. In view of the fact that the sectors of a file are originally written in physical sequence on blocks of the array, the cleanup process will occur immediately for any large files which are deleted by the host operating system and then deattached by the process of this invention since the logical sectors of such file will usually be positioned sequentially on a block or blocks of the array. This will have the effect of freeing the data space used by the files which are deattached and make the cleanup process operate much more efficiently.

Figure 3:
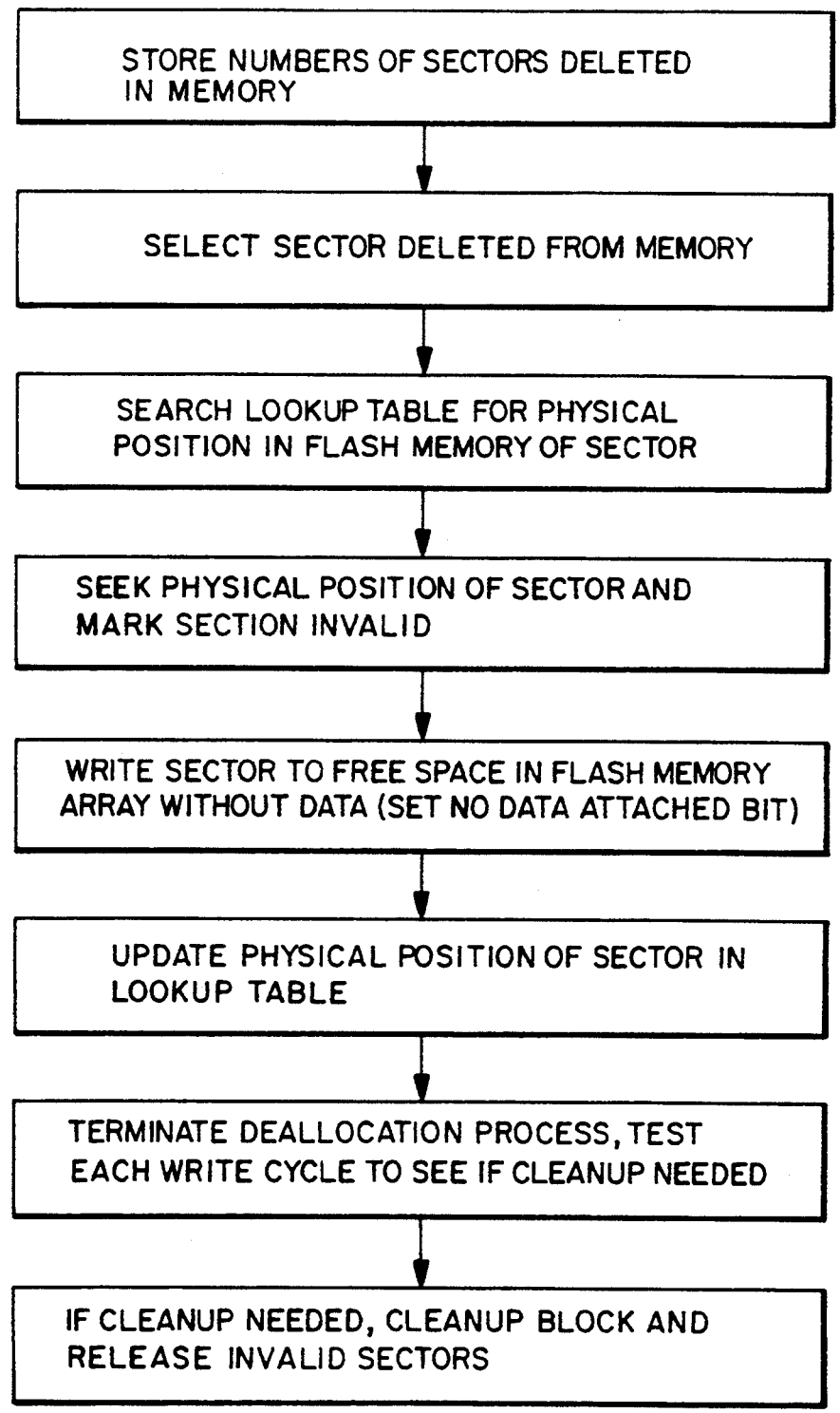
FIG. 3 is a flow chart illustrating a method in accordance with the present invention.

FIG. 3 illustrates the details of the process in accordance with the present invention. The process begins with the command "deattach" being presented to the microprocessor of the controller 14 along with the logical sector number to be deattached. As is illustrated, this may occur after the user selects a command to initiate a process such as the normal DOS delete command (or similar commands of another operating system) in which the file allocation table is searched to determine the sectors allocated to the file (or files) to be deleted and marks those sectors as free in the file allocation table.

The process moves to carry out the individual steps of the deattach process described above. To accomplish this, the process causes the controller 14 to write the logical sector from which data is to be deattached "with no data attached." For each selected sector, the controller 14 searches the lookup table 17 for the physical position of the sector specified. When it finds the physical position, the controller 14 seeks the sector in the memory array. When the sector is found, the process marks the header of the old sector as invalid. Next the controller writes the sector in free space in the memory array as a header with the "no data attached" bit set. The data at the old entry position is not written to the new position of the sector. For each sector written with no data attached, the controller 14 then updates the table 17 with the new physical position of the sector. The process may be enhanced by compiling a list of sectors to be deattached in a table before commencing the process. In such a case, the writing of sectors without data attached may continue until all of the sectors in that table have been handled in this manner.

When any block containing the dirty sectors produced by the deattaching process becomes sufficiently dirty (immediately for large files), the cleanup process will write the valid data remaining on the block to free space and erase the entire block. This releases the space allocated to data in the dirty sectors produced by cleanup to free space.

As pointed out above, this process will enhance the efficiency and performance of operation of the cleanup process and thus the operation of the flash EEPROM memory array.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method of releasing sectors of memory in a flash EEPROM memory array comprising the steps of:

storing a list of sectors to be deleted in a first table, selecting a sector from the first table, searching a second table for a physical position of the sector, seeking the sector specified by the physical position in the flash EEPROM memory array, marking a header of the sector found as invalid, writing in free space in the flash EEPROM memory array without data a new header for the sector found, updating the second table with a new physical position of the new header for the sector, and repeating the steps of selecting a sector from the first table until a selected number of sectors listed in the first table have been selected.

2. A method of releasing sectors of memory in a flash EEPROM memory array as claimed in claim 1 in which the step of writing in free space in the flash EEPROM memory array without data a new header for a sector found comprises furnishing an indication in a new header that no data is attached to the new header.

3. A method of releasing sectors of memory in a flash EEPROM memory array as claimed in claim 2 in which the step of furnishing an indication in a new header that no data is attached to the new header comprises setting a bit in a new header.

4. The method of releasing sectors of memory in a flash EEPROM memory array as claimed in claim 1 further comprising the steps of:

writing any valid data remaining in a selected portion of the flash EEPROM memory array to free space in the flash EEPROM memory array when a predetermined number of headers specified as invalid in the selected portion of the flash EEPROM memory array exist, and completely erasing the selected portion of the flash EEPROM memory array.

* * * * *